United States Patent [19]
Ban et al.

[11] Patent Number: 5,336,356
[45] Date of Patent: Aug. 9, 1994

[54] APPARATUS FOR TREATING THE SURFACE OF A SEMICONDUCTOR SUBSTRATE

[75] Inventors: Cozy Ban; Toshiaki Ohmori; Takaaki Fukumoto, all of Itami, Japan

[73] Assignee: Mitsubishi Denki Kabushiki Kaisha, Tokyo, Japan

[21] Appl. No.: 914,326

[22] Filed: Jul. 17, 1992

[51] Int. Cl.$^5$ .............................................. H01L 21/00
[52] U.S. Cl. ..................... 156/345; 156/626; 156/646; 156/662; 252/79.3; 134/3; 134/99.1; 134/102.1
[58] Field of Search ............... 156/646, 653, 626, 627, 156/345, 657, 662; 134/102.1, 31, 33, 3, 99.1; 252/79.3

[56] References Cited

U.S. PATENT DOCUMENTS

| | | | |
|---|---|---|---|
| 4,749,440 | 6/1988 | Blackwood et al. | 156/345 X |
| 5,022,961 | 6/1991 | Izumi et al. | 156/345 X |
| 5,089,084 | 2/1992 | Chhabra et al. | 156/646 |
| 5,089,441 | 2/1992 | Moslehi | 134/1 X |
| 5,100,495 | 3/1992 | Ohmi et al. | 156/646 X |
| 5,112,437 | 5/1992 | Watanabe et al. | 156/646 X |
| 5,167,761 | 12/1992 | Westendorp et al. | 156/646 |
| 5,173,152 | 12/1992 | Tanaka | 156/646 |

OTHER PUBLICATIONS

Novak et al, "The Dry Etching Of Oxides Using Anhydrous HF", Extended Abstracts of the 22nd (1990 International) Conference on Solid State Devices and Materials, Sendai, 1990, pp. 1091–1093.

Primary Examiner—Thi Dang
Attorney, Agent, or Firm—Leydig, Voit & Mayer

[57] ABSTRACT

In an apparatus for treating the surface of a semiconductor substrate, hydrogen fluoride is dissolved in a nonaqueous solvent, ionizing anhydrous hydrogen fluoride, and the solution is vaporized. The vapor of the solution is introduced onto the surface of the semiconductor in a reaction chamber to treat this surface. The semiconductor substrate can be subjected to treatments, such as cleaning and etching, without producing reactions products on the surface.

4 Claims, 7 Drawing Sheets

APPARATUS FOR TREATING THE SURFACE OF A SEMICONDUCTOR SUBSTRATE

BACKGROUND OF THE INVENTION

1. Field of The Invention

The present invention relates to an apparatus for treating the surface of a semiconductor substrate and a method of controlling the apparatus. More particularly, it pertains to an apparatus which performs a surface treatment, such as cleaning or etching, of an oxide film and the like on the surface of a semiconductor wafer, and to a method of controlling such an apparatus.

2. Description of Related Art

FIG. 7 is a schematic view showing the structure of a conventional apparatus for etching a surface, such as in cleaning, of a semiconductor substrate (hereinafter referred to as a surface treatment apparatus). In FIG. 7, an HF aqueous solution 7 prepared by dissolving hydrogen fluoride (HF) in water ($H_2O$) is contained in an HF aqueous solution tank 2. A carrier gas pipe 1 for introducing a carrier gas, such as an inactive gas like nitrogen gas, is disposed over the HF aqueous solution tank 2. A carrier gas cylinder 1a is connected to the carrier gas pipe 1 through a carrier gas valve 1b. A temperature adjusting device 12 is provided around the HF aqueous solution tank 2. Temperature control means 13 maintains the temperature of the HF aqueous solution 7 in the tank 2 at a fixed value, so that the vapor pressure of the HF aqueous solution 7 is maintained at a constant level, whereby a fixed amount of the HF aqueous solution 7 is vaporized. A vapor 7a of the HF aqueous solution is conveyed by the carrier gas which is fed through the carrier gas pipe 1, so it is then introduced into a reaction chamber 4 through a pipe 3 (hereinafter referred to as a vapor pipe). The reaction chamber 4 is provided with an exhaust pipe 6 for exhausting gas there-from.

The conventional surface treatment apparatus is constructed as described above. The vapor 7a of the HF aqueous solution 7 is introduced by the carrier gas into the reaction chamber 4. The carrier gas is fed into the HF aqueous solution tank 2 through the carrier gas pipe 1. Because HF is dissolved in water, the HF aqueous solution is ionized as follows:

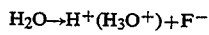

$$H_2O \rightarrow H^+(H_3O^+) + F^-$$

The vapor of the ionized HF aqueous solution flows to a silicon wafer 8 on a wafer stand 5. As shown in FIG. 8, the vapor reacts with an oxide film 10, such as $SiO_2$, with which device structures 9 are covered, so as to remove the oxide film 10.

The above-described surface treatment apparatus removes the oxide film 10 in the following manner. First, $SiO_2$ reacts with HF vapor as expressed by the following reaction equation (1):

$$SiO_2 + 6HF = H_2SiF_6 + 2H_2O \tag{1}$$

Then, $H_2SiF_6$ generated by reaction formula (1) decomposes into $SiF_4$ and 2HF as expressed by the following reaction equation (2):

$$H_2SiF_6 = SiF_4 + 2HF \tag{2}$$

$SiF_4$ is usually a gaseous substance at the temperature at which surface treatments, such as cleaning and etching, are performed, and is discharged through the exhaust pipe 6. However, because the solvent which dissolves HF is water and furthermore $H_2O$ is generated by reaction formula (1), before $SiF_4$ is removed from the surface of the silicon wafer 8, it is reacted with $H_2O$, as expressed by the following reaction formula (3):

$$3SiF_4 + H_2O = Si(OH)_4 + 2H_2SiF_6 \tag{3}$$

This reaction generates reaction products, such as $Si(OH)_4$ and $H_2SiF_6$, which are residues.

The same reaction products as those just mentioned above are also generated when tetraethyl orthosilicate (TEOS) is removed from the surface of a semiconductor wafer.

As shown in FIG. 9, such reaction products remain as a residue 11 between the device structures 9 on the silicon wafer 8. Conventionally, the residue 11 is first treated with water and a solvent, such as isopropyl alcohol, to remove it. However, water and isopropyl alcohol are liquids which do not enter completely into the gap between the device structures 9, and therefore the residue 11 cannot be removed completely.

SUMMARY OF THE INVENTION

The present invention has been made to solve the above problems. Accordingly, an object of this invention is to provide an apparatus for performing a surface treatment, such as cleaning or etching, of an oxide film on the surface of a semiconductor substrate, in which apparatus anhydrous HF and a solvent, excluding $H_2O$, ionizing HF, are utilized, and in which apparatus no reaction product remains on the surface of the semiconductor substrate.

Another object of this invention is to provide a method of controlling such an apparatus.

A further object is to provide another method of controlling the above apparatus by which the concentration of HF is maintained at a predetermined level so that a surface treatment can be performed with high accuracy in a well-controlled manner.

In order to achieve the above objects, according to one aspect of the present invention, there is provided an apparatus for treating a surface of a semiconductor substrate, in which hydrogen fluoride is led to the surface so as to treat it, the apparatus comprising: a solution tank in which anhydrous hydrogen fluoride is dissolved in a nonaqueous solvent ionizing hydrogen fluoride and forming a vapor of the hydrogen fluoride solution; and a reaction chamber in which the semiconductor substrate is disposed and in which the vapor of the hydrogen fluoride solution reaches and treats the surface of the semiconductor substrate.

According to another aspect of this invention, there is provided an apparatus for treating a surface of a semiconductor substrate, in which hydrogen fluoride is led to the surface so as to treat it, the apparatus comprising: means for supplying hydrogen fluoride gas; means for supplying a vapor of a nonaqueous solvent; a gas mixing device for mixing the hydrogen fluoride gas with the vapor of the nonaqueous solvent to form a vapor of a hydrogen fluoride solution; a reaction chamber in which the semiconductor substrate is disposed and the vapor of the hydrogen fluoride solution reaches and treats the surface of the semiconductor substrate; and means for supplying a carrier gas which carries the hydrogen fluoride gas from the means for supplying and the vapor of the nonaqueous solvent from the means for supplying supplying to the gas mixing device, the carrier gas also carrying the vapor of the hydrogen fluoride solution from the gas mixing device into the reaction chamber.

According to a further aspect of this invention, there is provided an apparatus for treating a surface of a semiconductor substrate, the apparatus comprising: means for supplying the vapor of a hydrogen fluoride solution; a reaction chamber in which a semiconductor substrate is disposed; means for supplying a carrier gas for carrying the vapor of the hydrogen fluoride solution into the reaction chamber; measurement means for measuring the pressure, temperature, concentration, and the like of the vapor of the hydrogen fluoride solution in the reaction chamber; means for measuring the thickness of a film on the surface of the semiconductor substrate; means for adjusting the amount of gas exhausted from the reaction chamber; and system control means wherein the amount of the vapor of the hydrogen fluoride solution supplied, the amount of the carrier gas supplied, and the amount of the gas exhausted are controlled through the system control means on the basis of measurement signals from the measurement means and the means for measuring the thickness of the film.

According to yet another aspect, there is provided an apparatus for treating a surface of a semiconductor substrate, the apparatus comprising: means for supplying hydrogen fluoride gas; means for supplying a vapor of a nonaqueous solvent; a gas mixing device for mixing the hydrogen fluoride gas with the vapor of the nonaqueous solvent to form a vapor of a hydrogen fluoride solution; a reaction chamber in which the semiconductor substrate is disposed, and into which the vapor of the hydrogen fluoride solution is supplied from the gas mixing device; means for supplying a carrier gas which carries the hydrogen fluoride gas and the vapor of the nonaqueous solvent to the gas mixing device, the carrier gas also carrying the vapor of the hydrogen fluoride solution from the gas mixing device into the reaction chamber; measurement means for measuring the pressure, temperature, concentration, and the like of the vapor of the hydrogen fluoride solution in the reaction chamber; means for measuring the thickness of a film on the surface of the semiconductor substrate; means for adjusting the amount of gas exhausted from the reaction chamber; and system control means wherein the amount of the hydrogen fluoride gas supplied, the amount of the vapor of the nonaqueous solvent supplied, the amount of the carrier gas supplied, and the amount of the gas exhausted are controlled by the system control means on the basis of measurement signals from the measurement means and the means for measuring the thickness of the film.

In this invention, $H_2O$ is excluded from the reaction gas since anhydrous HF is dissolved in the nonaqueous solvent ionizing HF and the vapor of the HF solution is used to remove the oxide film. The above nonaqueous solvent absorbs $H_2O$ generated by the reaction. It is therefore possible to treat the surface of the semiconductor substrate without causing reaction products to be generated on this surface.

Because the carrier gas conveys the vapor of the HF solution so that it is then introduced into the reaction chamber, the flow rate and temperature of the vapor can be satisfactorily adjusted to treat the surface of the semiconductor substrate.

The concentrations of HF and the nonaqueous solvent can be controlled separately. A wide range of parameters, such as concentration, can be obtained since the control of the surface treatment improves and is not affected by the boiling point of an azeotrope of HF and the nonaqueous solvent.

When, for example, the concentration of HF in the tank decreases, it is possible to maintain it at a constant level, and therefore to treat semiconductor substrates more uniformly than before. In addition, because it is possible to stop treating the surface of the semiconductor substrate precisely when the film attains the desired thickness, excessive etching and the like can be prevented.

Furthermore, the concentrations of HF and the nonaqueous solvent can be controlled separately and maintained at predetermined values so as to perform a surface treatment more accurately than that performed by the conventional apparatus.

DESCRIPTION OF THE PREFERRED EMBODIMENTS

Figure 1:
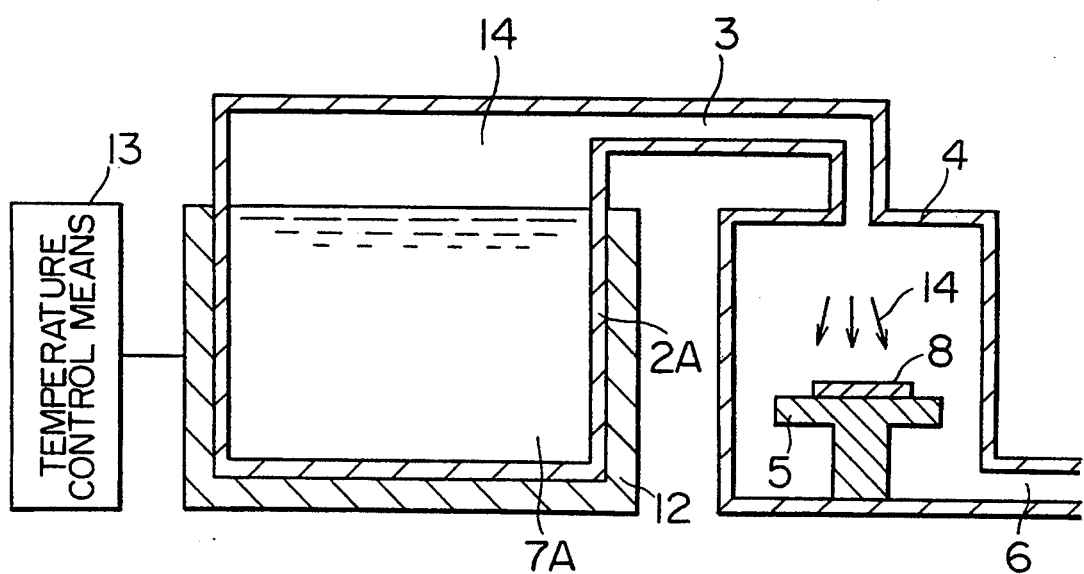
FIG. 1 is a schematic view showing the structure of a surface treatment apparatus in accordance with a first embodiment of the present invention.

FIG. 1 is a schematic view showing the structure of an apparatus for treating the surface of a semiconductor substrate (hereinafter referred to as a surface treatment apparatus) in accordance with a first embodiment of the present invention. Identical reference characters denote the same or corresponding components throughout the drawings. In FIG. 1, a hydrogen fluoride (HF) solution 7 is prepared by dissolving anhydrous HF in a solvent, excluding $H_2O$, which solvent is capable of ionizing anhydrous HF (hereinafter referred to as a nonaqueous solvent). The solution is contained in an HF solution tank 2A. Alcohols, such as $CH_3OH$, $C_2H_5OH$, $C_3H_7OH$ and $C_5H_{11}OH$; carboxylic acids, such as HCOOH, $CH_3COOH$, $\frac{1}{2}(COOH)_2$, $C_6H_5COOH$, and $(CH_3CO)_2O$; ketones such as $CH_3COCH_3$; ethers such as $(C_2H_5)_2O$; phenols such as $C_6H_5OH$; inorganic acids such as $H_2SO_4$; etc. may be used as the nonaqueous solvent.

When, for example, ethyl alcohol ($C_2H_5OH$) having a boiling point of 78.3° C. is used as the nonaqueous solvent, the vapor pressure of the solution can be maintained at 59.00 mmHg by maintaining the temperature of ethyl alcohol at 25° C. Anhydrous HF or 100% HF is dissolved in the solvent, and the concentration of the solution is adjusted to a desired value, for instance, 1%. At this time, the vapor pressure of the solution is substantially 59.00 mmHg.

While HF is ionized and dissolved in ethyl alcohol, it is scattered in the form of the vapor of an azeotrope of HF and alcohol. The vapor is introduced into a reaction chamber 4 through a vapor pipe 3. At this stage, pressure inside the reaction chamber 4 is assumed to be 760 mmHg.

The vapor pipe 3 is disposed diagonally over the HF solution tank 2A and connected to the reaction chamber 4. A temperature adjusting device 12 is disposed around the HF solution tank 2A. An unillustrated thermometer monitors the temperature of the HF solution 7A in the tank 2A, and temperature control means 13 maintains the temperature at the desired level. This temperature control makes it possible to maintain the vapor pressure of the HF solution 7A at a constant level, and therefore to vaporize a fixed amount of HF solution 7A. The vapor of the HF solution 7A is supplied to the reaction chamber 4 through the vapor pipe 3.

A wafer stand 5 on which a silicon wafer 8 is placed is installed in the reaction chamber 4. The vapor 14 of the HF solution is first supplied into the reaction chamber and then onto the silicon wafer 8. The vapor is used for performing a predetermined surface treatment, such as cleaning, and then exhausted outside the system through an exhaust pipe 6.

In the thus-constructed surface treatment apparatus, the HF solution 7A contained in the tank 2A is a solvent ionizing anhydrous $HF$, and is composed of anhydrous HF and a nonaqueous solvent, such as ethyl alcohol. The HF solution 7A does not include $H_2O$. As described previously, the temperature adjusting device 12 is disposed around the HF solution tank 2A. The temperature control means 13 maintains the temperature of the HF solution 7A in the tank 2A at a predetermined value. Because of the temperature control, a fixed amount of HF solution 7A is vaporized. The vapor 14 of the HF solution 7A is fed into the reaction chamber 4 through the vapor pipe 3.

HF reacts with an oxide film, such as $SiO_2$, as expressed by reaction formula (1), in which HF must be ionized. However, because a solvent, such as ethyl alcohol, ionizing HF is used for preparing the HF solution 7A, reaction formula (1) quickly proceeds rightwards owing to ionized HF. As a result, $H_2SiF_6$ and $H_2O$ are generated as expressed by the following formula:

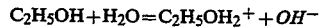

$$C_2H_5OH + H_2O = C_2H_5OH_2^+ + OH^-$$

$H_2O$ generated by reaction formula (1) is dissolved by ionization in ethyl alcohol, which is a nonaqueous solvent used for preparing the HF solution 7A. $H_2O$ is discharged as the vapor of an azeotrope through the exhaust pipe 6. On the other hand, $H_2SiF_6$ generated by reaction formula (1) decomposes into $SiF_4$ and HF, as expressed by reaction formula (2). However, since $H_2O$ is already dissolved in ethyl alcohol and removed, unlike in the conventional apparatus, $SiF_4$ is discharged through the exhaust pipe 6 without coming in contact with $H_2O$.

Figure 2:
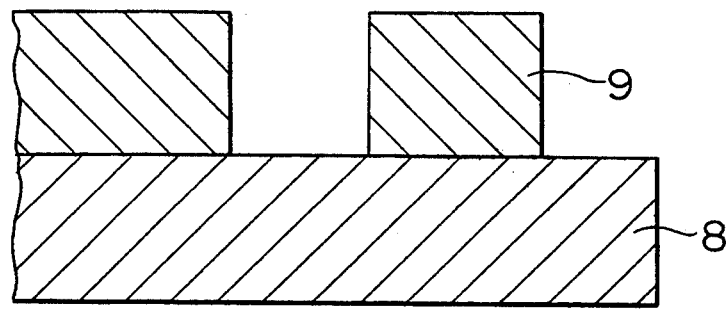
FIG. 2 is an enlarged sectional view showing the surface of the semiconductor substrate, which is a silicon wafer, with an oxide film removed.

Thus, in the first embodiment, since $H_2O$ generated by reaction formula (1) is removed by ethyl alcohol and since $H_2O$ is not used as a solvent for HF from the beginning, the reaction expressed by reaction formula (3) mentioned previously is unlikely to occur. Consequently, $Si(OH)_4$ and $H_2SiF_6$, reaction products, which prevent the surface of the silicon wafer 8 from being cleaned are unlikely to be generated. In this way, $SiO_2$ can be removed without producing a residue to contaminate the surface of the silicon wafer 8. In other words, although with the conventional apparatus the reaction products remain between device structures 9, with the surface treatment apparatus of this invention, the reaction products do not remain on the surface of the silicon wafer 8 as shown in FIG. 2, and thus the silicon wafer 8 can be cleaned.

Second Embodiment

Figure 3:
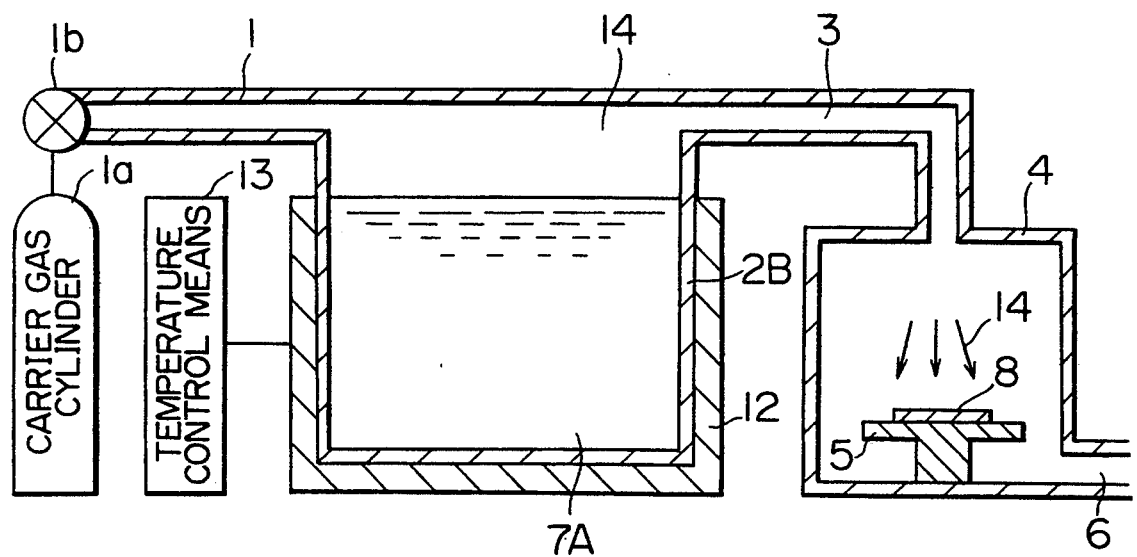
FIG. 3 is a schematic view showing the structure of a surface treatment apparatus according to a second embodiment of this invention.

FIG. 3 is a schematic view showing the structure of a surface treatment apparatus according to the second embodiment of this invention. In the above-described first embodiment, the temperature of the HF solution 7A is controlled to adjust the amount the solution 7A is vaporized. In the second embodiment, an inactive gas, such as nitrogen gas, is used as a carrier gas, and the vapor of an HF solution 7A in an HF solution tank 2B is introduced into a reaction chamber 4. In other words, the carrier gas can precisely adjust the flow rate and temperature of the vapor of the HF solution 7A. This embodiment is effective when a nonaqueous solvent, particularly one having a high boiling point, is used and when the surface of a silicon wafer is treated within a narrow temperature range.

In the operation of the surface treatment apparatus, an inactive gas, such as dry nitrogen, is used as the carrier gas for conveying the vapor of the HF solution 7A. The carrier gas is introduced from a carrier gas cylinder 1a into the HF solution tank 2B through a carrier pipe 1. Temperature control means 13 controls a temperature adjusting device 12 which maintains the vapor pressure of the HF solution 7A in the tank 2B at a constant level. Thus, a fixed amount of the vapor 14 of the HF solution 7A is supplied toward the upper part of the HF solution tank 2B. The carrier gas satisfactorily adjusts the flow rate and temperature of the vapor 14 of the HF solution 7A in the upper part of the tank 2B. The vapor 14 is supplied into the reaction chamber 4 through a vapor pipe 3.

In the same manner as in the first embodiment, inside the reaction chamber 4, HF in the form of the vapor 14 is reacted with $SiO_2$ on the surface of the silicon wafer 8 so as to perform a treatment, such as cleaning, on this surface. The carrier gas and the like are discharged outside the system through a discharge pipe 6.

Third Embodiment

In the first and second embodiments, the vapor of a solution prepared by dissolving anhydrous HF in a nonaqueous solvent is used to treat the surface of the silicon wafer 8. In the third embodiment, means for feeding anhydrous HF gas and means for feeding the vapor of a nonaqueous solvent 18 are provided separately. The anhydrous HF gas and the vapor of the nonaqueous solvent 18 are mixed together by a carrier gas, and then supplied into a reaction chamber 4. In the surface treatment apparatus shown in FIG. 4, an anhydrous HF cylinder 16 is provided separately from a nonaqueous solvent tank 17 containing the nonaqueous solvent 18. A temperature adjusting device 12 is disposed around the nonaqueous solvent tank 17. Temperature control means 13 adjusts the temperature of the nonaqueous solvent 18 so as to maintain the vapor pressure thereof at a constant level. A connecting valve 19 adjusts the flow rate of anhydrous HF fed from the anhydrous HF cylinder 16; similarly, another connecting valve 20 adjusts the flow rate of the vapor of the nonaqueous solvent 18 fed from the nonaqueous solvent tank .17. Anhydrous HF and the vapor of the nonaqueous solvent 18 are introduced to a gas mixing device 21 by the carrier gas having a fixed flow rate. The carrier gas is supplied from carrier gas cylinders 1c and 1e to carrier gas introducing pipes 15a and 15b through carrier gas introducing valves 1d and 1f, respectively.

Anhydrous HF and the vapor of the nonaqueous solvent 18 are conveyed by the carrier gas and mixed together in a predetermined ratio by the gas mixing device 21 to form a mixed and uniformly ionized vapor. The mixed vapor is introduced into the reaction chamber 4 through a vapor introducing pipe 22. In the same way as in the first and second embodiments, the mixed vapor is reacted with $SiO_2$ on the surface of the silicon wafer 8 so as to perform a treatment, such as cleaning, on this surface. With this apparatus, the concentrations of HF and the nonaqueous solvent can be controlled separately. A wide range of parameters, such as concentration, can be obtained since the control of surface treatment improves and is not affected by the boiling point of an azeotrope of HF and the nonaqueous solvent.

Fourth Embodiment

Figure 5:
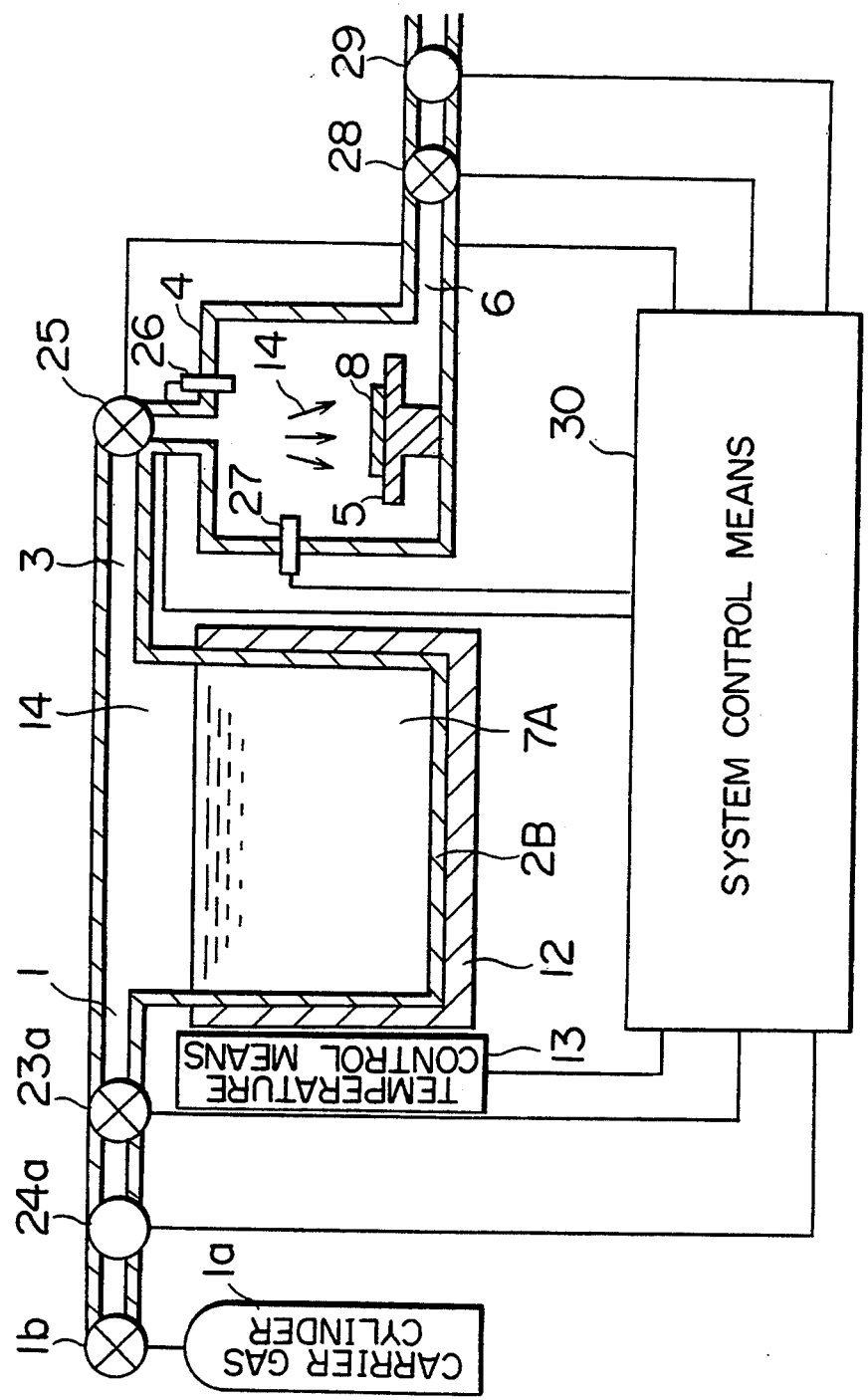
FIG. 5 is a schematic view illustrating a method of controlling a surface treatment apparatus according to a fourth embodiment of this invention.

A description will now be given of a method of controlling a surface treatment apparatus. The surface treatment apparatus shown in FIG. 5 is an apparatus illustrated in FIG. 3 to which system control means 30 is added. In FIG. 5, a carrier gas valve 23a for introducing the carrier gas and a carrier gas pump 24a for introducing the carrier gas are provided in the carrier gas pipe 1. The HF solution tank 2B is provided with the temperature adjusting device 12 and the temperature control means 13. A fine adjustment valve 25 for finely adjusting the flow rate of the vapor of the HF solution is provided in the vapor pipe 3 near the entrance of the reaction chamber 4.

Means, such as a film thickness measurement sensor 26, for measuring the thickness of a film on the surface of the silicon wafer 8, and means, such as a measurement sensor 27, for measuring the pressure, temperature, and concentration of the vapor of the HF solution, are provided in the reaction chamber 4. An exhaust valve 28 and exhaust pump 29, for adjusting the amount of an exhaust gas, are connected to the exhaust pipe 6. The temperature control means 13, carrier gas valve 23a, carrier gas pump 24a, fine adjustment valve 25, film thickness sensor 26, measurement sensor 27, exhaust pump 28 and exhaust pump 29 are all electrically connected to the system control means 30.

This surface treatment apparatus is controlled in the following manner. The carrier gas is introduced from the carrier gas pipe 1 into the HF solution tank 2B after the pressure and flow rate thereof have been set at predetermined levels by the carrier gas valve 23a and carrier gas pump 24. The vapor pressure of the HF solution 7A in the tank 2B is maintained at a predetermined value by the temperature adjusting device 12. The flow rate and temperature of the vapor 14 of the HF solution are first precisely adjusted by the carrier gas, and then the flow rate of the vapor 14 is again further precisely adjusted by the fine adjustment valve 25 while being supplied through the vapor pipe 3. The vapor 14 is then supplied to the reaction chamber 4.

Inside the reaction chamber 4, the film thickness sensor 26 measures the thickness of a film on the surface of the silicon wafer 8. The measurement sensor 27 measures the pressure, temperature, and concentration of the vapor of the HF solution in the reaction chamber 4. Measurement signals from the sensors 26 and 27 are transmitted to the system control means 30 which processes the measurement signals so that the surface of the silicon wafer 8 is treated optimally. The measurement signals are processed and then transmitted to the temperature control means 13, the carrier gas valve 23a, the carrier gas pump 24a, the fine adjustment valve 25, the film thickness sensor 26, the measurement sensor 27, the exhaust pump 28 and the exhaust pump 29. In this way, the pressure and temperature of the vapor of the HF solution being supplied into the reaction chamber 4 are controlled appropriately to optimally treat the surface of the silicon wafer 8. When, for example, the concentration of HF in the tank 2B decreases, it is possible to increase the amount the HF solution vaporized so that this concentration is maintained at a constant level, and therefore to treat semiconductor substrates more uniformly than before. In addition, because it is possible to stop treating the surface of the semiconductor substrate precisely when the film attains the desired thickness, etching and the like can be prevented from being performed excessively.

The film thickness sensor 26 measures the thickness of a film, such as $SiO_2$, on the surface of the silicon wafter 8 being treated. Because of the film thickness sensor 26, the thickness of the film is controlled through feedback from the system control means 30 so that the amount of etching is determined on the basis of the thickness of the film in its initial stage and the film is etched to the desired thickness. A generally known optical film thickness sensor, such as an ellipsometer, may be suitably used as the film thickness sensor 26.

The measurement sensor 27 measures the pressure, temperature, and concentration of the vapor of the HF solution in the reaction chamber 4. The pressure and temperature are factors which affect the equilibrium constants of treatments, such as cleaning and etching. By measuring and controlling the pressure and temperature, the equilibrium constants can be adjusted to appropriate values, and the etching rate and selectivity adjusted so as to conform to treatment conditions. Also, the desired etching rate and selectivity can be obtained when, for example, a natural oxide film on a thermal oxide film is to be removed.

Fifth Embodiment

Figure 4:
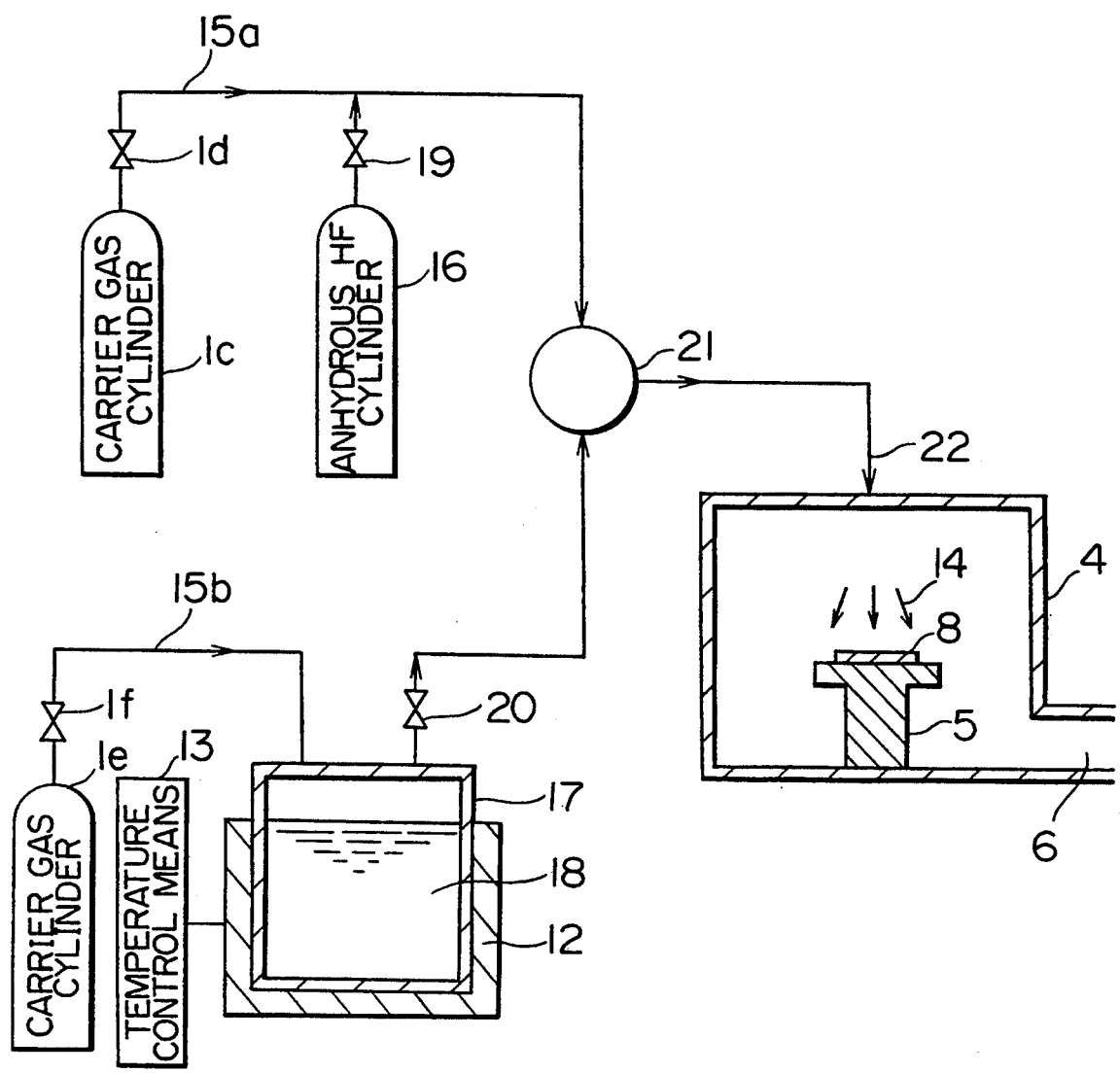
FIG. 4 is a schematic view showing the structure of a surface treatment apparatus according to a third embodiment of this invention.
Figure 6:
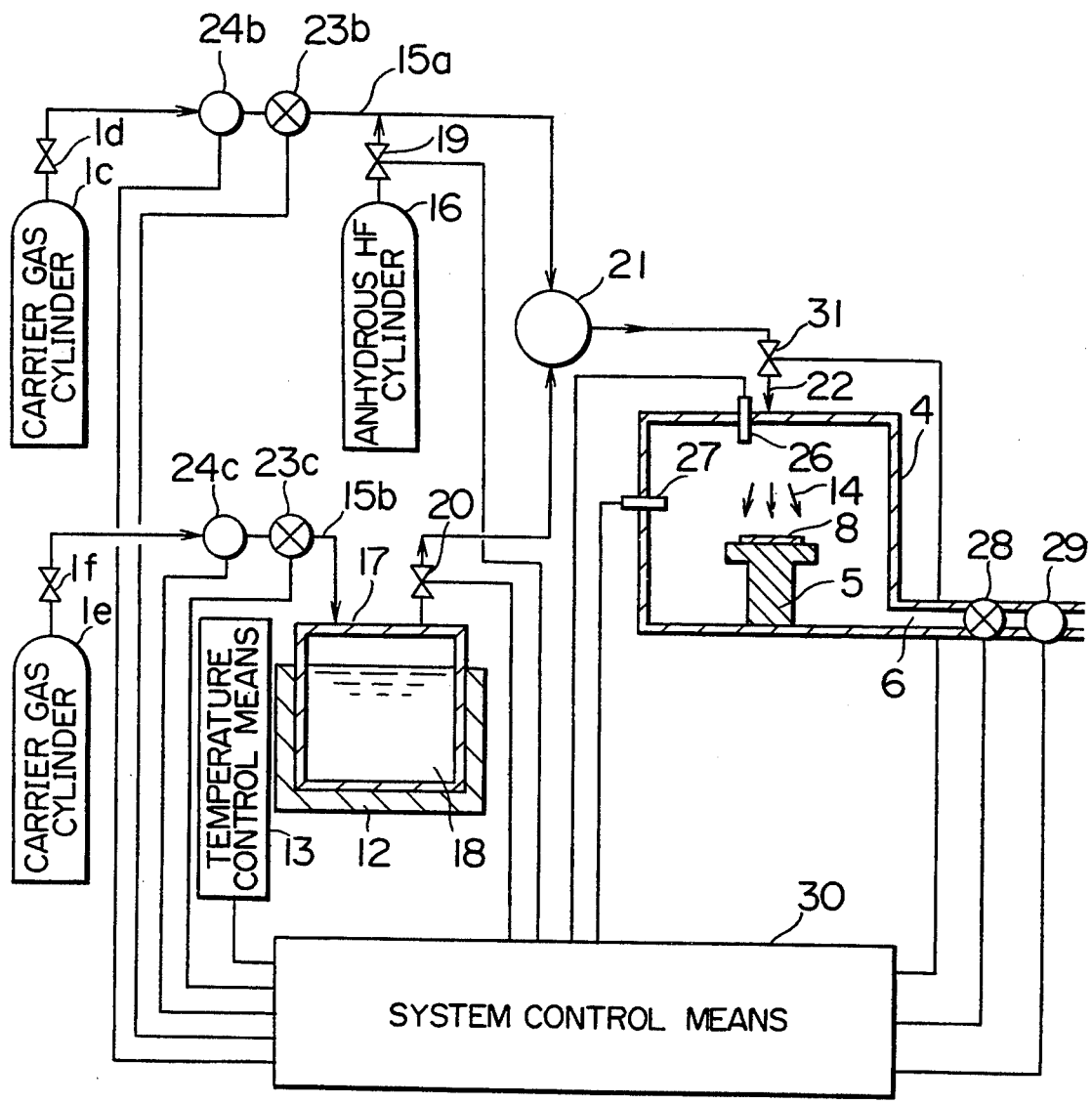
FIG. 6 is a schematic view illustrating another method of controlling a surface treatment apparatus according to a fifth embodiment of this invention.
Figure 7:
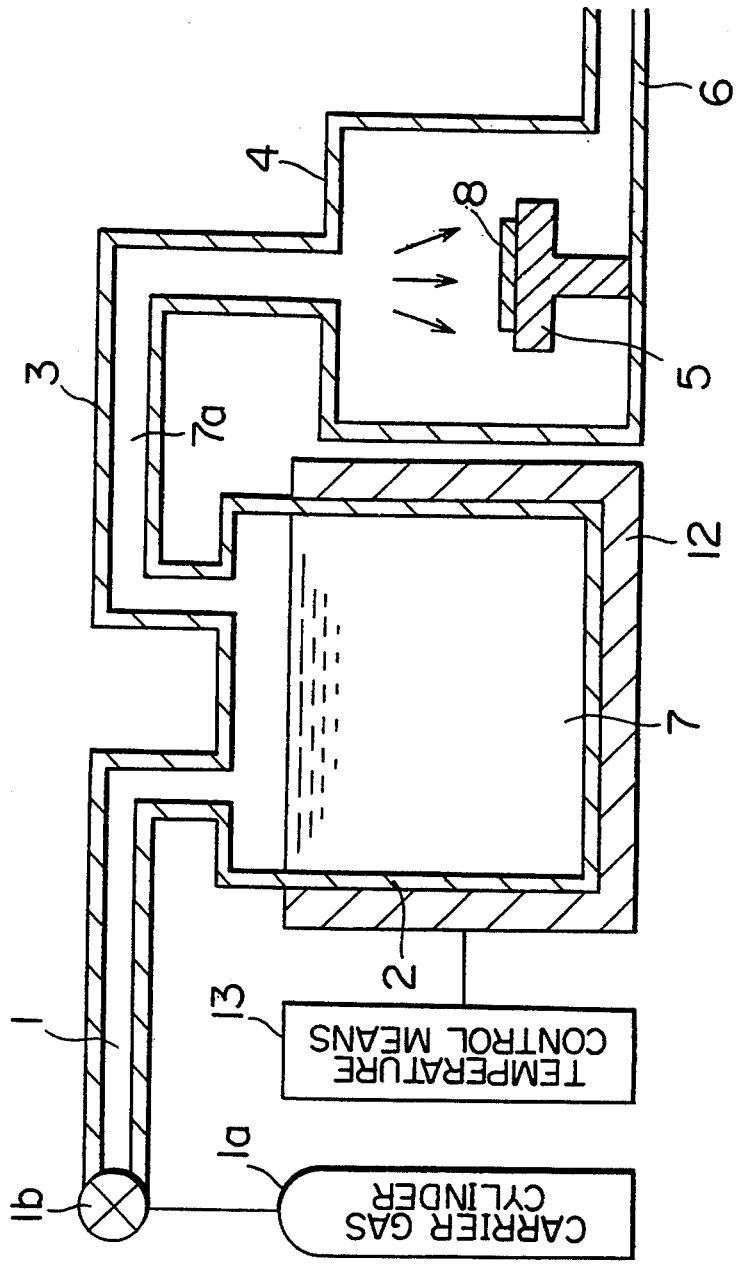
FIG. 7 is a schematic view showing the structure of the conventional surface treatment apparatus.
Figure 8:
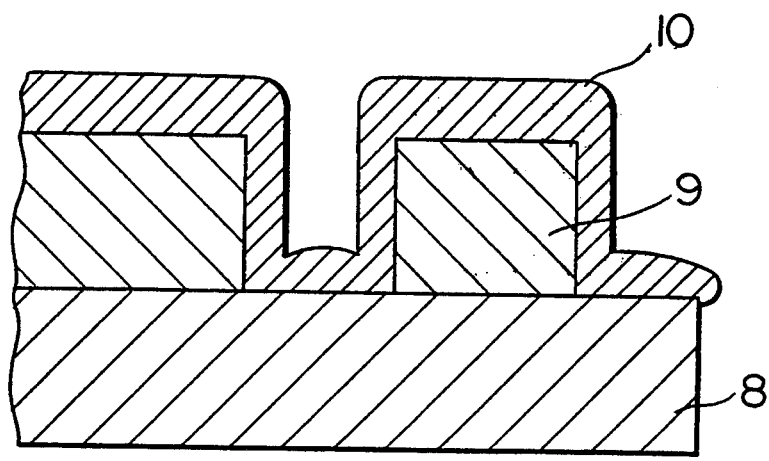
FIG. 8 is a sectional view showing a silicon wafer on which an oxide film is formed.
Figure 9:
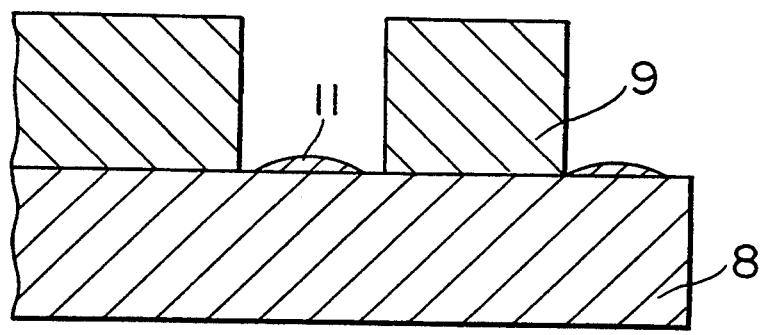
FIG. 9 is a sectional view showing the silicon wafer with the oxide film removed.

Another method of controlling a surface treatment apparatus will now be described, The surface treatment apparatus shown in FIG. 6 is an apparatus illustrated in FIG. 4 to which system control means 30 is added. In FIG. 6, a carrier gas valve 23b and carrier gas pump 24b are provided between a carrier gas cylinder 1c and anhydrous HF cylinder 16 for supplying an anhydrous HF gas. The valve 23b and pump 24b are used for introducing a carrier gas which adjusts the flow rate of the HF gas.

Another carrier gas valve 23c and another carrier gas pump 24c are provided between a carrier gas cylinder 1e and the nonaqueous solvent tank 17. The valve 23c and pump 24c are used for introducing the carrier gas which adjusts the flow rate of the vapor of the nonaqueous solvent 18. The nonaqueous solvent tank 17 is provided with a temperature adjusting device 12 and temperature control means 13.

A film thickness measurement sensor 26 for measuring the thickness of a film on the surface of the silicon wafer 8, and a measurement sensor 27 for measuring the pressure, temperature, and concentration of the vapor of the HF solution, are provided in the reaction chamber 4. An exhaust valve 28 and exhaust pump 29, both of which are means for adjusting the amount of an exhaust gas, are connected to the exhaust pipe 6 of the reaction chamber 4. The above-mentioned temperature control means 13, carrier gas valves 23b and 23c, carrier gas pumps 24b and 24c, film thickness sensor 26, measurement sensor 27, exhaust pump 28 and exhaust pump 29 are all electrically connected to the system control means 30. Connecting valves 19 and 20, and a fine adjustment valve 31 are also electrically connected to the system control means 30.

This surface treatment apparatus is controlled in the following way. The carrier gas is led to a carrier gas pipe 15 after the pressure and flow rate thereof have been set at predetermined levels by the carrier gas valve 23b and carrier gas pump 24b. The carrier gas, together with the anhydrous HF gas, is then led to a gas mixing device 21. The anhydrous HF gas is supplied from the anhydrous HF gas cylinder 16 after the flow rate thereof has been adjusted by the connecting valve 19. Another carrier gas is led into the nonaqueous solvent tank 17 after the pressure and flow rate thereof have been adjusted to predetermined levels by the carrier gas valve 23c and carrier gas pump 24c. The temperature of the nonaqueous solvent 18 is controlled by the temperature control means 13, whereby the vapor pressure of the solvent 18 is adjusted at a fixed value. The vapor of the nonaqueous solvent in the tank 17 is led to the gas mixing device 21 through the connecting valve 20.

The anhydrous HF gas and the vapor of the nonaqueous solvent 18 are conveyed by the carrier gas, mixed together in a predetermined ratio by the gas mixing device 21, and then formed into a uniformly ionized mixed vapor. The mixed vapor is led into the reaction chamber 4 through a mixed gas introducing pipe 22 after the flow rate thereof has been adjusted to the final level by a fine adjustment valve 31. In the same manner as in the embodiments described above, the mixed vapor is reacted with SiO$_2$ on the surface of the silicon wafer 8 so as to perform a treatment, such as cleaning, on this surface.

The film thickness sensor 26 in the reaction chamber 4 measures the thickness of a film on the surface of the silicon wafer 8. The measurement sensor 27 measures the pressure, temperature, and concentration of the mixed vapor. Measurement signals from the sensors 26 and 27 are transmitted to the system control means 30 which processes the measurement signals so that the temperature and concentration of the mixed vapor inside the reaction chamber 4 are the most suitable for treating the surface of the silicon wafer 8. The measurement signals are processed and then transmitted to the temperature control means 13, the connecting valves 19 and 20, the carrier gas valves 23b and 23c, the carrier gas pumps 24b and 24c, the film thickness sensor 26, the measurement sensor 27, the exhaust pump 28, the exhaust pump 29 and the fine adjustment valve 31. Thus, the surface of the silicon wafer 8 can be treated optimally. It is possible to perform a surface treatment more accurately according to the invention than in the conventional apparatus, especially because the concentrations of HF and a nonaqueous solvent are separately controlled and maintained at predetermined values.

What is claimed is:

1. An apparatus for treating a surface of a semiconductor substrate comprising:
   means for supplying hydrogen fluoride gas;
   means for supplying a vapor of a nonaqueous solvent;
   a gas mixing device for mixing the hydrogen fluoride gas with the vapor of the nonaqueous solvent to form a hydrogen fluoride solution vapor;
   a reaction chamber for containing a semiconductor substrate and to which the hydrogen fluoride solution vapor is supplied from said gas mixing device;
   means for supplying a carrier gas for carrying the hydrogen fluoride gas and the vapor of the nonaqueous solvent to said gas mixing device and for carrying the hydrogen fluoride solution vapor from said gas mixing device to said reaction chamber;
   measurement means for measuring the pressure, temperature, and concentration of the hydrogen fluoride solution vapor in said reaction chamber;
   means for measuring the thickness of a film on a surface of a semiconductor substrate disposed in said reaction chamber;
   means for adjustably exhausting gas from said reaction chamber; and
   system control means for controlling the quantity of the hydrogen fluoride gas supplied to said gas mixing device, the quantity of the vapor of the nonaqueous solvent supplied to said gas mixing device, the quantity of the carrier gas supplied, and the quantity of gas exhausted by said means for adjustably exhausting in response to pressure, temperature, and concentration measured by said measurement means and the thickness of the film measured by said means for measuring the thickness.

2. An apparatus as claimed in claim 1 wherein said control means stops the supply of the hydrogen fluoride solution vapor when the film thickness reaches a prescribed thickness.

3. An apparatus as claimed in claim 1 wherein the means for measuring the thickness comprises an ellipsometer mounted on said reaction chamber for monitoring the film thickness as the hydrogen fluoride solution vapor is being supplied to said reaction chamber.

4. An apparatus for treating a surface of a semiconductor substrate comprising:
   means for supplying hydrogen fluoride solution vapor;
   a reaction chamber for containing a semiconductor substrate;
   means for supplying a carrier gas for carrying a vapor of the hydrogen fluoride solution to said reaction chamber;
   measurement means for measuring the pressure, temperature, and concentration of the hydrogen fluoride solution vapor in said reaction chamber;
   means for measuring the thickness of a film on a surface of a semiconductor substrate disposed in said reaction chamber;
   means for adjustably exhausting gas from said reaction chamber; and
   system control means for controlling the quantity of the hydrogen fluoride solution vapor supplied, the quantity of the carrier gas supplied, and the quantity of gas exhausted in response to pressure, temperature, and concentration measured by said measurement means and the thickness of the film measured by said means for measuring.

* * * * *

UNITED STATES PATENT AND TRADEMARK OFFICE
CERTIFICATE OF CORRECTION

PATENT NO. : 5,336,356
DATED : August 9, 1994
INVENTOR(S) : BAN et al.

It is certified that error appears in the above-identified patent and that said Letters Patent is hereby corrected as shown below:

On the title page:

Insert Item 30, --Foreign Application Priority Data
[30] May 22, 1992    [JP] Japan......4-130486--.

Signed and Sealed this

Fifteenth Day of November, 1994

Attest:

BRUCE LEHMAN

Attesting Officer    Commissioner of Patents and Trademarks